United States Patent
Jacobs

(10) Patent No.: US 9,769,992 B2
(45) Date of Patent: *Sep. 26, 2017

(54) LIGHTING DEVICE

(71) Applicant: PHILIPS LIGHTING HOLDING B.V., Eindhoven (NL)

(72) Inventor: Joseph Hendrik Anna Maria Jacobs, Eygelshoven (NL)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 658 days.

This patent is subject to a terminal disclaimer.

(21) Appl. No.: 13/926,198

(22) Filed: Jun. 25, 2013

(65) Prior Publication Data

US 2013/0286628 A1 Oct. 31, 2013

Related U.S. Application Data

(63) Continuation of application No. 12/599,341, filed as application No. PCT/IB2008/051787 on May 7, 2008, now Pat. No. 9,642,316.

(30) Foreign Application Priority Data

May 14, 2007 (EP) ..................................... 07108178

(51) Int. Cl.
*A01G 9/22* (2006.01)
*A01G 9/26* (2006.01)
(Continued)

(52) U.S. Cl.
CPC .................. *A01G 9/26* (2013.01); *A01G 9/22* (2013.01); *D03D 1/007* (2013.01); *D03D 1/0047* (2013.01);
(Continued)

(58) Field of Classification Search
CPC .................... A01G 9/14; A01G 9/1438; A01G 2009/1461; A01G 13/02; A01G 13/0206; A01G 9/22; A01G 9/26
(Continued)

(56) References Cited

U.S. PATENT DOCUMENTS

| 4,567,732 | A | | 2/1986 | Landstrom et al. |
| 4,569,150 | A | | 2/1986 | Carlson et al. |
| 4,858,377 | A | * | 8/1989 | Oglevee et al. .................. 47/17 |
| 5,269,093 | A | | 12/1993 | Horaguchi et al. |
| 5,321,907 | A | | 6/1994 | Ueno et al. |
| 5,440,461 | A | | 8/1995 | Nadel et al. |

(Continued)

FOREIGN PATENT DOCUMENTS

| ES | 2255885 A1 | 7/2006 |
| GB | 2350997 A | 12/2000 |

(Continued)

*Primary Examiner* — David Parsley

(57) ABSTRACT

A shading device for a greenhouse includes a shading element and at least one lighting element, wherein the shading element comprises an outer side and an inner side. The shading element is formed from interwoven electrically conductive first thread elements and electrically insulating second thread elements. The first and/or second thread elements each may be adapted for reflecting an ambient light. The lighting element(s) may be arranged at the inner side of the shading element and connected with the first thread elements, and the lighting element(s) may be driven by an electrical current, conducted by the first thread elements, resulting in the emission of an artificial light, which may illuminate a plant growing in the greenhouse.

16 Claims, 2 Drawing Sheets

(51) Int. Cl.
    *D03D 1/00*     (2006.01)
    *D03D 15/00*     (2006.01)
    *F41H 3/02*     (2006.01)
    *H05K 1/02*     (2006.01)
    *H05K 1/03*     (2006.01)

(52) U.S. Cl.
    CPC ........... *D03D 1/0088* (2013.01); *D03D 15/00* (2013.01); *D03D 15/0011* (2013.01); *D03D 15/0066* (2013.01); *D03D 15/0088* (2013.01); *F41H 3/02* (2013.01); *D10B 2101/06* (2013.01); *D10B 2101/08* (2013.01); *D10B 2101/20* (2013.01); *D10B 2321/041* (2013.01); *D10B 2321/10* (2013.01); *D10B 2401/16* (2013.01); *D10B 2401/22* (2013.01); *D10B 2505/18* (2013.01); *H05K 1/0274* (2013.01); *H05K 1/038* (2013.01)

(58) Field of Classification Search
    USPC .......................... 47/17, 20.1, 29.1, 29.2, 29.3
    See application file for complete search history.

(56) References Cited

U.S. PATENT DOCUMENTS

| | | |
|---|---|---|
| 5,818,734 A | 10/1998 | Albright |
| 7,144,830 B2 | 12/2006 | Hill et al. |
| 7,184,846 B2 | 2/2007 | Albright et al. |
| 7,214,557 B2 * | 5/2007 | Nakata ............. H01L 31/02008 257/E25.02 |
| 7,617,057 B2 * | 11/2009 | May et al. ...................... 702/62 |
| 2006/0032115 A1 | 2/2006 | Van Den Dool |
| 2008/0148630 A1 * | 6/2008 | Ryan et al. ....................... 47/17 |

FOREIGN PATENT DOCUMENTS

| | | |
|---|---|---|
| GB | 2396252 A | 6/2004 |
| WO | 03021679 A2 | 3/2003 |
| WO | 2004057079 A1 | 7/2004 |
| WO | 2004100111 A2 | 11/2004 |
| WO | 2006054899 A1 | 5/2006 |
| WO | 2006129272 A2 | 12/2006 |

\* cited by examiner

LIGHTING DEVICE

FIELD OF THE INVENTION

This invention relates to a shading device for a greenhouse.

BACKGROUND OF THE INVENTION

In horticulture plant production greenhouses are often equipped with artificial light sources to extend the growing period of the plants, beyond the point where the sun has set. Furthermore, this allows a producer to bring plants on the market on demand, independent of the season. To achieve this aim normally high pressure sodium lamps (HPS) are used. However, this causes a number of problems. First of all, the supplemental light emission causes light pollution, annoying people who are living in the proximity of the greenhouse. To reduce the disturbance, shading devices are used which shade the illuminated inner part of the greenhouse from the surrounding. The shading devices may either cover the windows or are arranged above the planting area of the greenhouse. Furthermore, high pressure sodium lamps typically generate light in the green/yellow spectrum. However, the absorption spectra of most common pigments of plants are in a different frequency range.

As the "duty cycle" and the intensity of the sunlight often fluctuate, the artificial light sources are not only used to extend the growing period but also to achieve a constant illumination of the plants. Therefore, the shading device is not only prohibiting the flow of the artificial light into the surrounding but also the intrusion of sunlight into the greenhouse.

In the GB 2 396 252 A a textile fabric is disclosed, comprising surface mounted LEDs and connective tracks. The connective tracks, which may be yarns woven in the fabric or printed on the fabric, are connected with the LEDs. To drive the LEDs, an electrical current is flowing through the conductive tracks. Unfortunately, the described textile fabric absorbs the heat of the sun. Furthermore, the interwoven electrical yarns are difficult and expensive to produce.

Thus, the invention has for its object to eliminate the above mentioned disadvantages. In particular, it is an object of the invention to provide a shading device for a greenhouse, which on the one hand protects the plants within the greenhouse from environmental impacts and on the other hand illuminates the plants.

SUMMARY OF THE INVENTION

This object is achieved by a shading device for a greenhouse as taught by claim 1 of the present invention. Advantageous embodiments of the shading device for a greenhouse are defined in the subclaims.

The object of the invention is achieved by a shading device for a greenhouse, with a shading element and at least one lighting element, wherein the shading element comprises an outer side and an inner side, the shading element is formed from interwoven electrically conductive first thread elements and electrically insulating second thread elements, the first thread element comprises a reflective mean, reflecting an ambient light, the lighting element is arranged at the inner side of the shading element and connected with the first thread element, and the lighting element is driven by an electrical current, conducted by the first thread element, resulting in the emission of an artificial light, illuminating a plant growing in the greenhouse.

The disclosed shading device combines the ability to protect plants in a greenhouse against an ambient light and to emit artificial light, possessing an intensity and wavelength spectrum favorable for the plants. Additionally, different types of lighting elements can be used to reduce the total cost of ownership in the greenhouse application. In the context of the invention two different types of light occur: an artificial light and an ambient light. The artificial light is generated by the lighting element, arranged at the inner side of the shading element. The ambient light may either be sunlight, shining onto the greenhouse, a synthetic light, emitted by an illumination device in the greenhouse or artificial light, reflected by the plants or the inner structure of the greenhouse.

The invention discloses a reflective mean, reflecting the ambient light and being arranged on the first thread element. This reflective mean may in a first preferred embodiment be a reflective layer. If the first thread element is a yarn, it may be advantageous that the reflective layer is a coating, cladding the thread element. Such a coating can be put onto the yarn-like first thread element in an immersion bath.

In another preferred embodiment the first and/or the second thread element comprise an outer surface and an inner surface. The outer surface of the thread elements is a part of an outer side of the shading element. Likewise, the inner surface is a part of an inner side of the shading element. Depending on the type of use, different arrangements of the reflective mean on the surfaces of the thread elements are possible. In a first alternative the outer surface of the first thread element is covered with the reflective mean. So the sunlight shining onto the greenhouse is reflected and prevented from illuminating the plants. This effect can be increased by covering also the outer surface of the second thread element with the reflective mean. In a further alternative the inner surface of the first thread element is covered with the reflective mean. Therefore, not only the ambient light within the greenhouse but also the artificial light emitted by the lighting element is reflected onto the plants. This increases the efficiency of the shading device. As has been said before, this effect further can be increased by covering the inner surface of the second thread element with a reflective mean.

The reflective mean may be a foil like element, being connected with one of the inner or outer surfaces of the first and/or second thread element. The connection may be done through different methods, as for example by gluing or welding the foil like reflective mean to the surface. Apart from this merging, the reflective mean may be produced by thin film deposition techniques, such as ion beam deposition, electron beam deposition or chemical vapor deposition. In a preferred embodiment, the reflective mean comprises a height between 20 µm to 800 µm, preferably between 50 µm to 500 µm.

In another preferred embodiment the reflective mean and the first thread element are one-piece. Such kind of first and/or second thread elements are easy and cheap to produce as no gluing or welding is needed. Furthermore, such kind of thread elements often possesses an enhanced mechanical stability, which is useful to produce shading devices with a large size.

According to a preferred embodiment the lighting mean is an LED, an OLED, a dielectric barrier discharge (DBD) lamp, a gas discharge lamp, a high intensity discharge lamp, an incandescent lamp, a fluorescent lamp or a high pressure sodium lamp. The shading device may comprise a number of lighting elements, which are spatially distributed on the shading element to achieve a homogeneous illumination. According to a preferred embodiment the shading device comprises a combination of at least two different types of the named lighting elements. For example, the shading device may comprise a combination of a high pressure sodium lamp and an LED, a combination of an LED and an OLED or a combination of a high pressure sodium lamp and an OLED.

LEDs (Light Emitting Diode) have the advantage that their spectrum can be designed such that it exactly meets the requirements of plants. The said advantage also apply to an OLED (Organic Light Emitting Diode) which is a special type of a light emitting diode in which the emissive layer may comprise a thin film of certain organic components. The advantage of the OLED is that it is a homogeneous large area light source with potentially low cost and high efficiency and hence, OLEDs are better suited for horticulture applications where the total cost of ownership is important. These OLEDs utilize current, flowing through a thin-film of organic material to generate light. The color of light being emitted and the efficiency of the energy conversion from current to light are determined by the composition of the organic thin-film material.

According to another embodiment of the invention the shading device may comprise at least two different types of lighting elements, wherein the first lighting element delivers a grow light and the second lighting element delivers a control light for the plant. It is known, that the sheer growth of the plant is mainly depending on the amount of light, possessing the wavelength absorbed by Chlorophyll A or B. To achieve a generous growth of the plant the first lighting element should comprise at least two types of LEDs/OLEDs, emitting at different wavelength. It is preferred that the first type of LEDs/OLEDs emits in the region of blue light with a wavelength between 400 nm to 500 nm. Furthermore, the second type of LEDs/OLEDs should emit in the region of red light between 600 to 700 nm. In another preferred embodiment the grow light emitted by the first lighting element may consists of approximately 80% to 90% red light and 10% to 20% blue light.

In addition to the described grow light, control light should be used to steer the growth of the plant. The growths of a plant whether it is huge or small and compact can be controlled by illuminating the plant with light of different colors. It is known, that the use of a large amount of blue light (400 nm to 500 nm) results in a tall plant whereas the use of a small amount of blue light results in a small and compact plant. Furthermore, it is believed that the light in the green spectrum increases the tendency of the plant to propagate. In addition, by using light with the appropriate wavelength the blooming of the plants can be controlled. So by controlling the type of wavelength being emitted onto the plants, the way and the manner of the growing of the plant can be controlled.

To achieve homogeneous illumination, a number of lighting elements may be arranged uniform on the inner side of the shading device. Each lighting element is thereby connected to the first thread element. In a preferred embodiment the first thread element comprises a circuit mean conducting the electrical current to drive the lighting element. Depending on the type of lighting elements, the needed current and/or voltage may vary strongly. Therefore, the form and size of the circuit mean may differ, depending on the type of lighting element. In a first embodiment the circuit mean may be mounted onto one of the surfaces of the first thread element. Therefore, an easy connection of the lighting element and the first thread element is possible. Furthermore, a subsequent mounting of lighting elements on an already existing shading device may be done. If, for example, the type or the number of lighting elements should be changed, they can be clipped into the shading element respectively to the first thread element. In a second embodiment the circuit mean is arranged within the first thread element. This enhances the safety of the shading device, because a person touching it cannot get in contact with the circuit mean. Therefore, if higher currents and/or voltages are needed to drive the lighting element this embodiment is advantageous. On the other hand the design of the circuit mean is depending on the use of the shading device. If the shading device possesses a tile like structure, positioned in front of one of the windows and being displaced as a whole, the circuit mean may easily be arranged on the outer surface. If, on the other hand, the shading device possesses a textile structure and can be folded or rolled together, it is more convenient if the circuit mean is embedded within the first thread element.

Depending on the type of use, the first thread element and/or the circuit mean may comprise at least one metal or metal-oxide and/or at least one of the following materials: aluminum, copper, zinc, tin, iron, silver, ITO (indium tin oxide), chromium or magnesium. Each of the named metals possesses a high electrical conductivity, resulting in the ability to conduct an electrical current. The named metals may be evaporated onto the surface of the first thread element resulting in a surface layer, used to transport the electrical current. This embodiment has the advantage that the circuit mean also absorbs the function of the reflective layer. For example, aluminum possesses a high electrical conductivity and a high reflectivity. Therefore, a circuit mean made of aluminum would not only transport the current with low resistivity but also reflect the ambient light of the sun and/or the artificial light of the lighting element. Last named advantage would prevent the heating up of the shading device as well as focusing the artificial light emitted by the lighting element.

In another preferred embodiment the second thread element comprises an electrical isolating material, to prevent a short circuit from occurring. Therefore, the second thread element should comprise at least one of the following materials: a plastic, preferably PVC or XLPE, a polymer, preferably an acryl, glass, ceramic or mica. Each of the named materials prevents an electrical current from passing through the second thread element. The electrical insulating material may coat the outer surface of the second thread element. In this embodiment the electrical insulating material may also work as the reflective layer of the second thread element, reflecting the artificial and/or ambient light.

In another preferred embodiment the circuit mean of the first thread element is connected with a source. Furthermore, other parts of the power supply may be integrated within the shading device. This would result in the ability to steer different lighting elements, positioned onto the shading element. If the shading device possesses a large size, it may be appropriate that different first thread elements are connected with different sources, resulting in the ability to mount a plurality of different light emitting elements onto the shading device. Such a shading device would possess the ability to emit artificial light with different wavelength, as the needed light spectrum may also vary for different types of plants. Furthermore, a microcomputer connected to a central computer device may manage the supply of electrical current to the individual first thread elements respectively lighting elements.

In another preferred embodiment the first and/or the second thread element comprises a band like form. Such band like form results in a coarse meshed textile, forming the shading element. Band like thread elements are easy to produce and equip with the circuit respectively reflective mean. Furthermore, the described thread elements form shading devices, which are covering the whole area of a greenhouse. Therefore the uniform screening/illumination of all plants, growing within the greenhouse, is possible.

The aforementioned shading device, as well as claimed components and the components to be used in accordance with the invention in the described embodiments, are not subject to any special exceptions with respect to size, shape, material selection. Technical concepts such that the selection criteria are known in the pertinent field can be applied without limitations. Additional details, characteristics and advantages of the object of the present invention are disclosed in the subclaims and the following description of the respective figures—which are an exemplary fashion only—showing a plurality of preferred embodiments of the shading device according to the present invention.

The invention further relates to a method to operate a shading device according to claim 1 comprising the steps
  adjusting the amount of an artificial light emitted by a lighting element in response to the amount of an ambient light in order to achieve a constant illumination of the plants during day time, and
  adjusting the amount of artificial light emitted by the lighting element at night to a higher amount compared to the amount of the artificial fight during day time.

In an embodiment the amount of artificial light at night is adjusted to the total amount of ambient light and artificial light during day time. The driver of the shading device may comprise sensors to detect the total amount of light (artificial light+ambient light) in order to adjust the drive parameter of the shading device to achieve a suitable adjustment of the amount of artificial light in response to the ambient light during day light and to adjust the amount of artificial light during night. Sensors detecting the amount of light are known by people skilled in the art.

BRIEF DESCRIPTION OF THE DRAWINGS

These figures are.

DETAILED DESCRIPTION OF EMBODIMENTS

Figure 1:
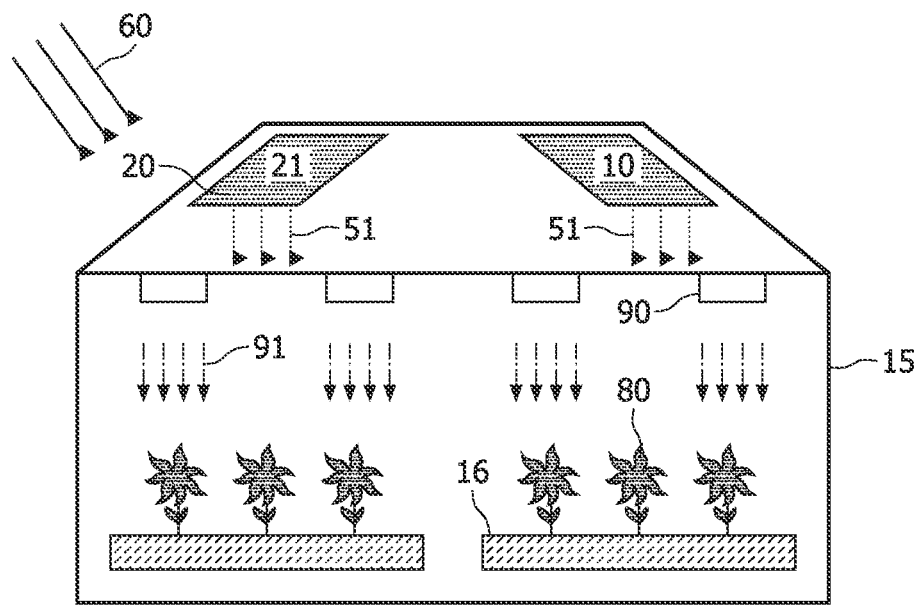
FIG. 1 shows a schematic view of a greenhouse.

FIG. 1 shows a schematic view of a greenhouse 15 according to the present invention. In the greenhouse 15, two rows of flower beds 16 are shown. The flower bed 16 contains a soil or a substrate in which a plant 80 is grown. As research has shown, the optimal growth of the plant 80 is depending on the availability of a number of resources. The growth of the plant 80 is directly correlated with its photosynthesis, being the synthesis of sugar from light, carbon dioxide and water, with oxygen as a waste product. So one of the main resources, responsible for the growth of the plant 80 is the available amount of light, absorbed by Chlorophyll A and B.

To achieve supplemental growth in greenhouse applications lamps 90 are used to increase the illumination time of the plants or the light intensity. Therefore, the plants are still illuminated by synthetic light 91 if the sun has already set. A popular lamp 90 used in greenhouse applications is the high pressure sodium (HPS) lamp. However, HPS lamps 90 typically generate synthetic light 91 in the yellow/green spectrum. Unfortunately, the absorption spectra of the most common pigments of plants 80 are in a different frequency range. Furthermore, if illuminated by an artificial light source 90, the greenhouse 15 causes light pollution during the night. As regulations limit the light level of greenhouses 15 during specific hours of the day, a shading device 10 is needed to avoid the synthetic light 91 leaving the greenhouse 15. In FIG. 1 two shading devices 10 are shown, both arranged in the roof of the greenhouse 15. The shading device 10 comprises a shading element 20, blocking an ambient light 60—also quoted as sunlight. In the shown embodiment no ambient light 60 is able to enter the greenhouse 15.

Figure 2:
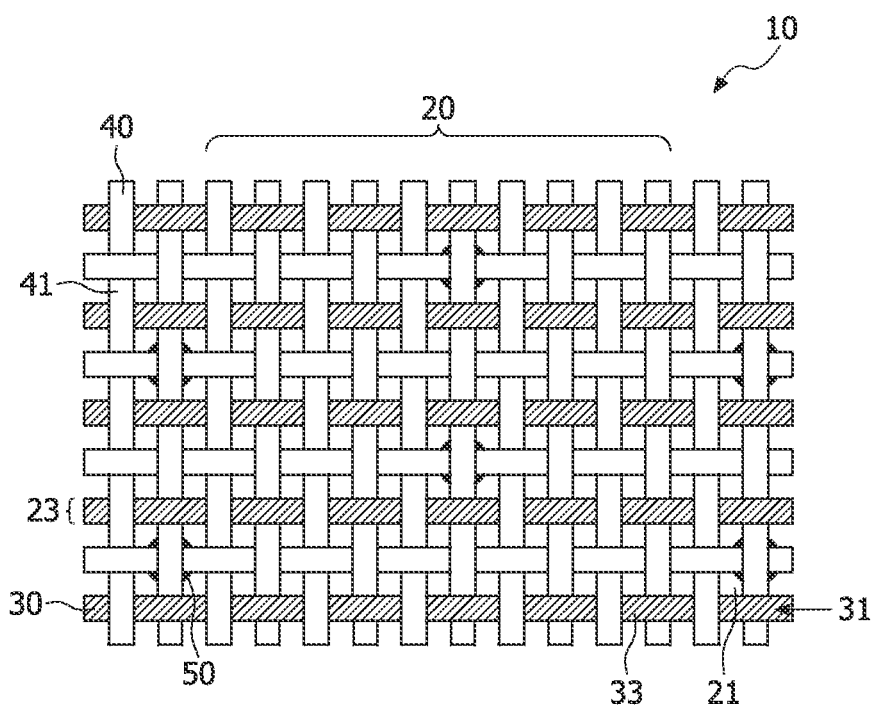
FIG. 2 shows an outer side of a shading device.

To achieve the object of the invention to protect the plant 80 from environmental impacts as well as to illuminate the plant 80, a shading device 10 is disclosed. In FIG. 2 a section of an outer side 21 of the shading device 10 is shown. The shading device 10 comprises a number of first thread elements 30 and second thread elements 40, which are interwoven to form a textile. The outer side 21 of the shading device 10 is formed by an outer surface 31, 41 of the first thread element 30 respectively second thread element 40. In the shown embodiment the first thread element 30 possesses a reflective mean 33—here a reflective layer—which is able to reflect the ambient fight 60. As the shading device 10 is used to screen the plants 80 in the greenhouse 15 from the directly incident sunlight 60 the shading device 15 is arranged in such a way, that the outer side 21 is facing the sun. The reflective mean 33 possesses the ability to reflect the sunlight 60, so that neither the greenhouse 15 nor the shading device 10 is heated up.

The shading device 10 comprises a fabric like structure, formed by the first thread element 30 and the second thread element 40. Both thread elements 30, 40 comprise a band like outer form. The rectangular thread elements 30, 40 may possess a width 23, which is between 2 mm and 5 cm, resulting in a coarse meshed textile. Such textile structures have the advantage that the shading device 10 is light weighted and possesses the ability to efficiently shade the plants 80. Nevertheless, a circulation of air through the shading device 10 is possible. Therefore, a heat exchange from the outer side 21 to an inner side 22 of the shading device 10 is possible.

Figure 3:
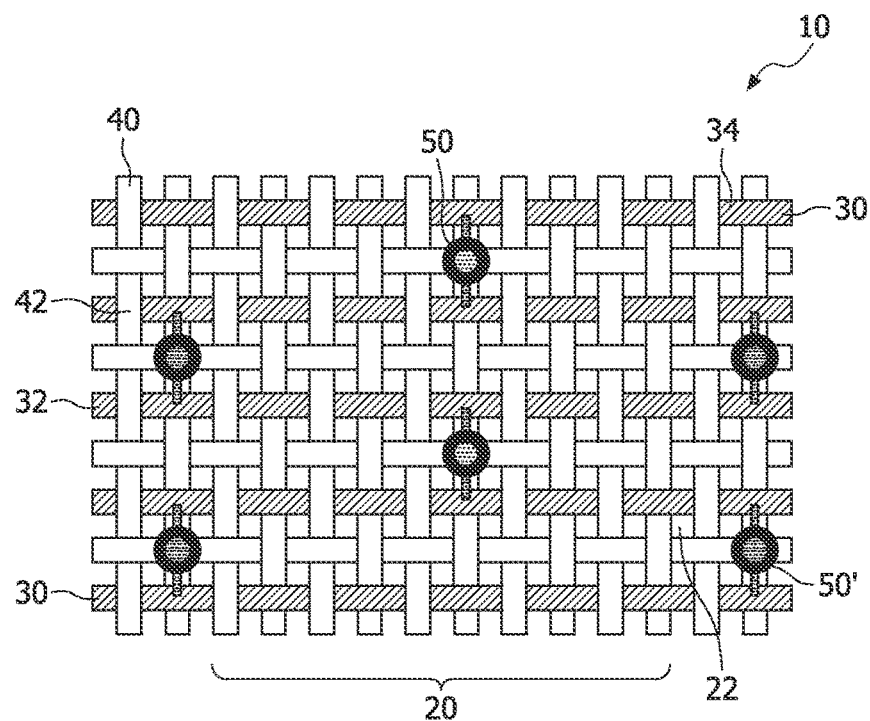
FIG. 3 shows a schematic view of an inner side of the shading device.

In FIG. 3 the inner side 22 of the shading device 10 is shown. In contrast to the outer side 21 shown in FIG. 2, a number of lighting elements 50, 50' can be seen. Those lighting elements 50, 50' are used to illuminate the plants 80 within the greenhouse. In the shown embodiment these lighting elements 50, 50' are light emitting diodes (LEDs). The LEDs have the advantage to emit an artificial light 51, which possesses a wavelength within a frequency spectrum, not filled by the synthetic light 91 of the lamps 90 but important for the growth of the plants 80. The lighting elements 50, 50' are connected with two of the first thread elements 40. To emit the artificial light 51 the lighting elements 50, 50' have to be driven with an electrical current. Therefore, the first thread element 30 possesses a circuit mean 34 to be electrically conductive. The circuit mean 34 in the shown embodiment is a surface layer, covering an inner surface 32 of the first thread element 30. The circuit mean 34 may comprise a metal such as aluminum, silver, chromium or tin, which possess a small electrical resistance.

To prevent a short circuit the second thread element 40 is made of an insulating material like a polymer or a ceramic.

Figure 4:
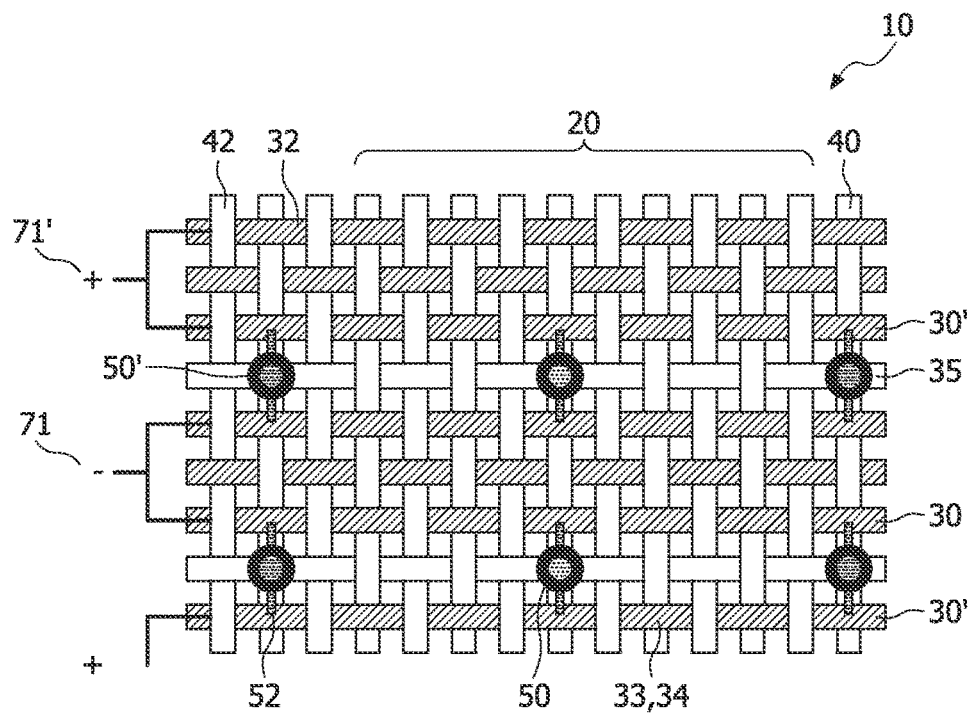
FIG. 4 shows another embodiment of the shading device.

FIG. 4 illustrates a circuit diagram for the shading device 10. A negative electrical voltage 71 is attached to two parallel first thread elements 30, 30'. As the thread elements 30, 40 possess macroscopic width 23, a coarse meshed textile is formed so that no direct contact between the two first thread elements 30, 30' occurs. Onto the two named first thread elements 30, 30' a number of lighting elements 50, 50' are mounted. An electrical current, conducted by the first thread element 30, 30' is driving the lighting elements 50, 50', resulting in the emission of an artificial light 51, illuminating the plants 80. To connect the lighting elements 50, 50' with the first thread elements 30, 30', contact bridges 52 are used. Those contact bridges 52 may possess the ability to be reversible clipped onto the first thread elements 30, 30'. Therefore, the number and type of lighting elements 50, 50' could be matched to the needed circumstances. As has been mentioned, the growth of the plant 80 depends mainly on the amount of light possessing a wavelength within the absorption spectra of Chlorophyll A and B. Therefore, it may be appropriate to change and/or adjust the amount of artificial light 51 emitted within one of the named wavelength bands. In the shown embodiment four lighting elements 50' and two lighting elements 50 are arranged on the shading device 10. Depending on the type of plant 80 it may be appropriate to change the number and/or type of lighting elements 50, 50', each possessing individual emission spectra.

To drive the lighting elements 50, 50' the contact bridges 52 are also connected with a positive electrical voltage 71'. To prevent a short circuit from occurring, an insulating first thread element 35 is positioned between the two first thread elements 30, 30', possessing an opposing electrical potential.

To increase the efficiency of the shading device 10 not only the outer side 21 hut also the inner side 22 of the shading element 20 may possess the ability to reflect an ambient light 60. To achieve this aim the inner surface 32 of the first thread element 30, 30' may be covered with the reflective mean 33. Thus, artificial light 51 emitted by the lighted element 50, 50' may be reflected by the reflective mean 33 positioned on the inner surface 32. Also ambient light 60 reflected from the plants 80 may in be reflected from the shading device 10. Altogether this increases the efficiency of the shading device 10 and decreases the need of artificial light 51. Furthermore, an inner surface 42 of the second thread element 40 may be covered with a reflective mean 33 to enhance the amount of the reflected ambient light 60.

The shading device 10 shown in FIG. 4 comprises a first thread element 30, 30', possessing the inner surface 32, which is covered by a surface forming the reflective mean 33 as well as the circuit mean 34. Therefore, the both two named means are one-piece. This can be achieved if a metal layer is deposited onto the inner surface 32. Such metal layer can on the one hand conduct the needed electrical current and on the other hand reflect an ambient light 60.

LIST OF NUMERALS 10 shading device
15 greenhouse
16 flower bed
20 shading element
21 outer side
22 inner side
23 width of first respectively second thread element
30, 30' first thread element
31 outer surface of first thread element
32 inner surface of first thread element
33 reflective mean
34 circuit mean
35 insulating first thread element
40 second thread element
41 outer surface of second thread element
42 inner surface of second thread element
50, 50' lighting element
51 artificial light
52 contact bridges
60 ambient light
71, 71' electrical voltage
80 plant
90 lamp
91 synthetic light

The invention claimed is:

1. A lighting device, comprising:
a substrate having a first side and a second side; and
a plurality of lighting elements mounted on the first side of the substrate,
wherein the substrate comprises a plurality of electrically conductive first thread elements and plurality of electrically insulating second thread elements, wherein the plurality of electrically conductive first thread elements and plurality of electrically insulating second thread elements are interwoven together, each of the first and second thread elements including a first side disposed at the first side of the substrate, and a second side disposed at the second side of the substrate,
wherein at least some of the electrically conductive first thread elements each comprise a yarn having a first reflective coating provided on and cladding at least one of the first side and the second side thereof for reflecting ambient light,
wherein at least some of the electrically insulating second thread elements each comprise a yarn having a second reflective coating provided on and cladding at least one of the first side and the second side thereof for reflecting ambient light,
wherein the first reflective coating comprises a metallic material and the second reflective coating comprises an insulating material different than the first reflective coating material, and
wherein each of the lighting elements is electrically connected between two of the electrically conductive first thread elements so as to be configured to be supplied electrical current by the electrically conductive first thread elements and in response thereto to emit an artificial light.

2. The lighting device of claim 1, wherein the plurality of lighting elements are distributed uniformly on the first side of the substrate.

3. The lighting device of claim 1, wherein at least some of the electrically conductive first thread elements comprise the yarn having the first reflective coating provided on and cladding both the first side and the second side thereof.

4. The lighting device of claim 1, wherein the first reflective coating is aluminum.

5. The lighting device of claim 1, wherein the first reflective coating comprises at least one of aluminum, copper, zinc, tin, iron, silver, indium-tin-oxide, chromium, and magnesium.

6. The lighting device of claim 1, wherein at least some of the electrically insulating second thread elements comprise the yarn having the second reflective coating provided on and cladding both the first side and the second side thereof.

7. The lighting device of claim 1, wherein the second reflective coating comprises at least one of ceramic, glass, and mica.

8. The lighting device of claim 1, wherein the lighting elements comprise a plurality of first lighting elements and a plurality of second lighting elements, wherein each the first lighting elements comprises at least one first light emitting diode (LED) which emits blue light with a wavelength between 400 nm and 500 nm, and at least one second LED which emits red light with a wavelength between 600 nm and 700 nm.

9. The lighting device of claim 1, wherein the cladding of the first reflective coating and the cladding of the second reflective coating result from an immersion bath.

10. A lighting device, comprising:
a substrate having a first side and a second side, wherein the substrate comprises:
a plurality of electrically conductive first thread elements, including a first side disposed at the first side of the substrate, and a second side disposed at the second side of the substrate,
a plurality of reflective elements provided on both the first and the second side of at least some of the plurality electrically conductive first thread elements, for reflecting ambient light; wherein the reflective elements comprise a metallic material,
a plurality of electrically insulating second thread elements, including a first side disposed at the first side of the substrate, and a second side disposed at the second side of the substrate, wherein at least some of the electrically insulating second thread elements each comprise a yarn having a second reflective coating provided on and cladding at least one of the first side and the second side thereof for reflecting ambient light; wherein the second reflective coating comprises an insulating material different than reflective elements provided on the first thread elements,
wherein the plurality of electrically conductive first thread elements and plurality of electrically insulating second thread elements are interwoven together;
a plurality of lighting elements mounted on the first side of the substrate, wherein each of the lighting elements is electrically connected between two of the electrically conductive first thread elements so as to be configured to be supplied electrical current by the electrically conductive first thread elements; and
a driver configured to supply an electrical voltage across pairs of the electrically conductive first thread elements to drive the plurality of lighting elements to emit artificial light, the driver comprising sensors configured to detect an amount of light in a greenhouse where the light device is installed, and to adjust an amount of the artificial light emitted by the lighting elements.

11. The lighting device of claim 10, wherein the lighting elements comprise a plurality of first lighting elements and a. plurality of second lighting elements, wherein the driver drives the first lighting elements to deliver a growth light to plants within the greenhouse, and drives the second lighting elements to deliver a control light to plants within the greenhouse.

12. The lighting device of claim 11, wherein the growth light consists of 80% to 90% red light and a remainder being blue light.

13. The lighting device of claim 12, wherein the control light comprises green light.

14. The lighting device of claim 12, wherein the control light comprises blue light.

15. The lighting device of claim 10, wherein the driver is configured to adjust the amount of the artificial light emitted by the lighting elements during day time to achieve a constant illumination of plants disposed within the greenhouse during the day time.

16. The lighting device of claim 10, wherein the driver is configured to adjust the amount of the artificial light emitted by the lighting elements such that the amount of artificial light emitted at night is to equal a total amount of ambient light and artificial light during day time.

* * * * *